(12) United States Patent
Grange

(10) Patent No.: US 7,233,055 B2
(45) Date of Patent: Jun. 19, 2007

(54) CHIP CIRCUIT COMPRISING AN INDUCTOR

(75) Inventor: Sebastien Grange, Fontaine (FR)

(73) Assignee: STMicroelectronics SA, Montrouge (FR)

( * ) Notice: Subject to any disclaimer, the term of this patent is extended or adjusted under 35 U.S.C. 154(b) by 141 days.

(21) Appl. No.: 11/009,695

(22) Filed: Dec. 10, 2004

(65) Prior Publication Data
US 2005/0212084 A1    Sep. 29, 2005

(30) Foreign Application Priority Data
Dec. 11, 2003  (FR) .................................. 03 14532

(51) Int. Cl.
*H01L 29/00*    (2006.01)
*H01L 23/552*    (2006.01)
(52) U.S. Cl. ...................... 257/659; 257/531
(58) Field of Classification Search ................ 257/659, 257/700, 758, 531
See application file for complete search history.

(56) References Cited
U.S. PATENT DOCUMENTS 6,075,700 A    6/2000  Houghton et al.
6,486,534 B1 *  11/2002  Sridharan et al. ........... 257/758
6,611,041 B2    8/2003  Maeda et al.
7,042,312 B2    5/2006  Sul et al.
7,141,883 B2   11/2006  Wei et al.
2002/0109204 A1  8/2002  Acosta et al.
2002/0140081 A1 10/2002  Chou et al.
2002/0158306 A1 10/2002  Niitsu
2002/0180538 A1 12/2002  Sooraapanth et al.
2003/0127704 A1 *  7/2003  Kobayashi et al. ......... 257/531
2005/0275061 A1 * 12/2005  Ohguro ...................... 257/531

FOREIGN PATENT DOCUMENTS

EP    1 017 102 A1    7/2000

* cited by examiner

*Primary Examiner*—Cuong Nguyen

(57) ABSTRACT

A chip circuit comprising a chip which comprises a semiconductor substrate and substantially plane components formed on the said substrate, among which there are an emitting component capable of emitting electromagnetic radiation and an inductor sensitive to the incident electromagnetic radiation. At least one shield, external to the chip, is placed opposite the inductor at a distance of less than 500 microns. The shield thus makes it possible to shield the sensitive inductor from the emitting component, while maintaining the quality factor of the inductor.

20 Claims, 4 Drawing Sheets

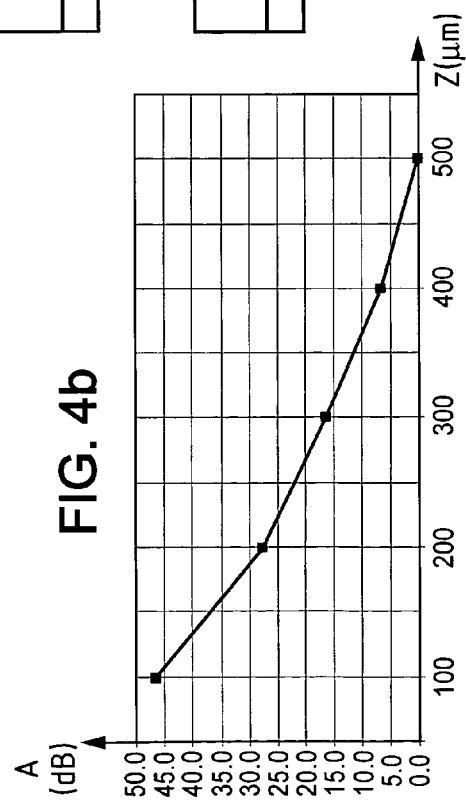
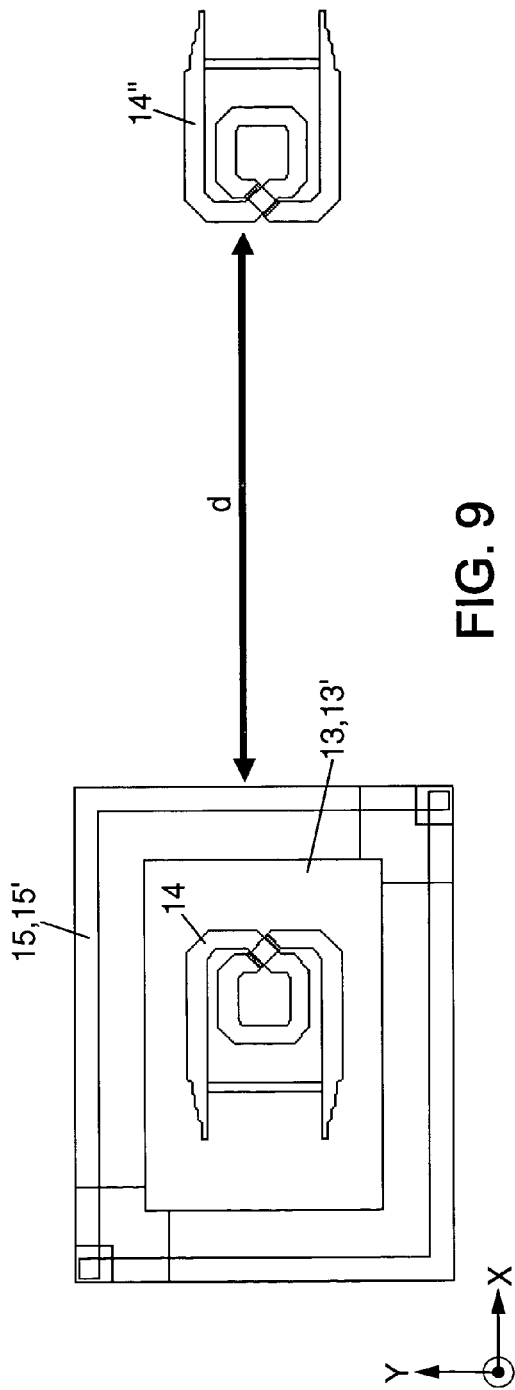

CHIP CIRCUIT COMPRISING AN INDUCTOR

TECHNICAL FIELD OF THE INVENTION

The present invention relates to chip circuits, in which the chip comprises at least one semiconductor substrate and a substantially plane inductor formed on this substrate.

BACKGROUND OF THE INVENTION

Considerable progress has been made in microelectronics allowing more and more functions to be integrated onto a single chip. This increased integration has many advantages, among which is the fewer external components and the smaller footprint.

Thus, chips integrate complete RF (radiofrequency) transmission systems, which may include VCOs (voltage controlled oscillators), PLLs (phase-locked loops), mixers, power preamplifiers, etc.

However, the integration of many components on one and the same substrate has drawbacks. It causes, especially at high frequency, parasitic signal coupling that interferes with certain of the functions of the chip, for example the VCO. These parasitic signals are signals generated by elements of the chip that interfere with other elements of this same chip. Penetration of such parasitic signals into a VCO at its oscillation frequency is generally called "VCO pulling". VCO pulling is especially the result of a parasitic signal of frequency equal to the 2nd harmonic (H2) of the operating frequency. Particularly sensitive elements, and consequently in particular victims of such interference, are the inductors integrated into the chips.

There are many consequences of this parasite phenomenon within a chip, which may include, for example in the case of the VCO, generation of parasitic lines, modulation of the operating frequency of the VCO, degradation of the phase error or else oscillation of the VCO at a frequency other than that desired.

Various means are known for overcoming these drawbacks. A number of them rely on improving the linearity of the parasitic signal generator blocks at H2; this improved linearity may be achieved by supplying these blocks with a higher current. Other means are used to increase the useful signal of the VCO (at the frequency H1) relative to the interfering signal by increasing the current consumed by the VCO. However, these solutions involve an increase in the electrical consumption.

Document U.S. Published Patent Application No.A-2002/0180538 discloses a VCO architecture for reducing the effects of VCO pulling by using two signals at frequencies such that the sum of the frequencies is equal to the desired output frequency, while eliminating parasitic effects. However, this solution involves additional components and is relatively complex to implement.

Moreover, U.S. Pat. No. 6,611,041 discloses an integrated circuit comprising a substantially plane inductor and a shield that is parallel to the plane of the inductor and faces the latter, formed within silicon. The aim is to have the shape of the shield so as to prevent any current flow in the shield and therefore any magnetic field that would thus be generated. Such a shield therefore constitutes mainly one that shields out parasitic electrical signals. It also allows the quality factor of the inductor to be optimized by reducing ohmic losses towards the substrate. However, it requires the integration of an additional element in the substrate and increases the complexity of the chip. In addition, it does not shield out magnetic parasitic signals.

On the other hand, the prior art also teaches shields placed outside a chip of an integrated circuit in order to protect the chip or the integrated circuit from external interference. Such shields are in general placed outside the package containing the chip and are located on the electronic card in order to shield the circuits regarded as being sensitive and the circuits regarded as being sources of interference. In particular, they are placed a certain distance from the chip inductors for the purpose of not modifying the magnetic field of the inductors nor to degrade their quality factor. To do this, these shields are placed more than 500 microns (μm) from the inductor.

Moreover, U.S. Pat. No. 6,486,534 describes an integrated circuit comprising a first circuit and at least a second circuit in which a Faraday cage, comprising vias and a ground plane within the substrate, is placed around the first circuit in order to protect the second circuit from electromagnetic interference produced by the first circuit (column 2, lines 14–18). Thus, to protect a sensitive element, for example an inductor of a VCO, from disrupting elements, the teaching provided by that document suggests placing one or more Faraday cages around the disrupting elements. However, this means not forgetting one of them. Moreover, this solution is expensive. Furthermore, by implementing this solution, the sensitive element is not protected from an unanticipated external disrupting element, for example a user's finger coming close to the VCO.

SUMMARY OF THE INVENTION

To address the above-discussed deficiencies of the prior art, the present invention aims to propose a chip circuit comprising at least one chip having a shield for the inductor of the chip, which is less affected by the limitations of the prior art.

For this purpose, the invention proposes a chip circuit comprising a chip. This chip comprises at least one semiconductor substrate and substantially plane components formed on the substrate. Among these components there are at least one component emitting electromagnetic radiation and an inductor which is sensitive to incident electromagnetic radiation and which it is desired to protect from this radiation. The chip circuit includes at least a first shield external to the chip, lying parallel to the plane of the sensitive inductor and placed opposite the said sensitive inductor at a distance of less than 500 μm. This shield thus makes it possible for the sensitive inductor to be shielded from the emitting component or components, while still allowing the quality factor of the inductor to be maintained.

Such a shield is inexpensive and does not require the integration of additional electronic functions in the chip. Moreover, it constitutes not only a shield for shielding from electric fields, but also magnetic fields. It is particularly advantageous in the near field, that is to say it is suitable for the case in which electronic blocks that cause interference and electronic blocks that are interfered with are separated by a distance of less than $\lambda/2\pi$ where $\lambda$ is the wavelength of the electromagnetic field in question, this condition generally being the case for electronic blocks within one and the same chip. The shield also allows the inductor to be protected from unanticipated interfering elements, such as a user's finger.

Advantageously, the distance between the plane of the inductor and the first shield is greater than or equal to 100 μm.

In one particularly effective embodiment, the distance between the sensitive inductor and the emitting component is greater than 1 mm (millimetre).

To allow greater shielding against interference, the orthogonal projection of the first shield on the plane of the inductor to be protected includes the entire inductor. Advantageously, the orthogonal projection of the first shield on the plane of the inductor extends beyond at least one of the edges of the inductor by a minimum distance of 150 microns.

In one embodiment, the chip lies parallel to a first support, the distance from the chip to the first support being determined by the diameter of bumps (solder balls) of a first type that are used for electrically connecting the chip to the first support, the first shield being produced in the first support.

In one embodiment, a second shield lies parallel to the plane of the inductor and is placed opposite the inductor to be protected at a distance of between 100 and 500 μm, the first and second shields lying on either side of the inductor.

In one embodiment, the chip circuit furthermore includes a second support parallel to the first support, the first and second supports being located on either side of the chip. The distance from the chip to the second support is determined by the diameter of bumps of a second type that are used for electrically connecting the first support to the second support, and the second shield is produced in the second support.

In one embodiment, the chip circuit furthermore includes a second shield lying parallel to the plane of the inductor and placed opposite the inductor, the first and second shields lying on either side of the inductor. The second shield has an annular shape and its orthogonal projection on the plane of the inductor surrounds the latter.

Advantageously, the distance between the plane of the inductor and the second shield is less than or equal to 30 μm.

Advantageously, the orthogonal projection of the second shield on the plane of the inductor extends beyond at least one of the edges of the inductor by a distance of 0.25 mm.

In one embodiment, the second shield is formed on the substrate of the chip.

In one embodiment, the chip comprises a VCO and the sensitive inductor is an element of the VCO.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

Other features and advantages of the invention will become more apparent from the reading of the following description. This is purely illustrative and must be read with regard to the appended drawings in which like reference numerals represent like parts, and in which:

FIG. 4b is a graph showing the attenuation, provided by the chip circuit of FIG. 1, of the parasitic magnetic field due to the coupling between two inductors integrated into one and the same chip, as a function of the distance between the plane of the protected inductor and the shielding planes in one embodiment of the invention;

FIGS. 8a and 8b are tables illustrating the attenuation of the parasitic signals, at the frequency H2, produced by the chip circuits according to the invention shown respectively in FIG. 5 and FIG. 7; and FIG. 9 shows the configuration adopted for establishing the tables in FIGS. 8a and 8b.

DETAILED DESCRIPTION OF THE INVENTION

FIGS. 1 through 9, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged chip circuit having at least one semiconductor substrate and a substantially plane inductor formed on this substrate.

Figure 1:
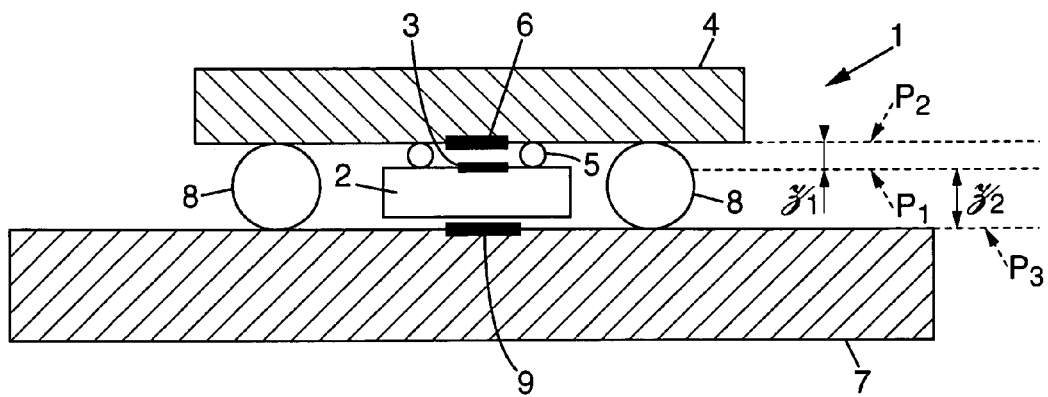
FIG. 1 shows a chip circuit in a first embodiment of the invention.

FIG. 1 shows a chip circuit 1 in a first embodiment of the invention. The chip circuit 1 comprises at least one chip 2. The chip 2 comprises a semiconductor substrate on which various components are formed. Integrated especially into this chip 2 is a VCO that includes a substantially plane inductor 3 formed on the substrate and lying in a plane $P_1$.

The inductor 3 of the VCO behaves as a receiving antenna sensitive to the ambient electromagnetic fields.

The inductor 3 therefore intercepts the electromagnetic field lines generated especially by other components integrated on the chip, which behave with respect to the inductor 3 to be protected as interfering components, thereby introducing parasitic currents and voltages in the inductor 3, and therefore in the VCO.

The chip circuit 1 further includes a support 4 to which the chip 2 is attached. The support 4 is, in the case described here, a package of the BGA (ball grid array) type joined to the chip by solder balls 5 or bumps 5, electrically connecting the chip to the BGA package 4. The chip 2 lies parallel to the BGA package 4 and the distance from the chip to the package 4 is determined by the diameter of the bumps 5 used.

In the embodiment in question, the final diameter of the bumps 5 after mounting is 150 μm.

The BGA package 4 includes a shield 6. This shield 6 is a metal layer of good electrical conductivity, for example made of copper, of the BGA package 4 (for example the layer 1 of the BGA package) lying in a plane $P_2$ parallel to the plane $P_1$ of the inductor 3 and facing the inductor 3. The shield 6 describes, for example, a rectangle in the plane $P_2$. The dimensions of the shield 6 are such that the projection of the shield 6 on the plane $P_1$ entirely contains the inductor 3.

Figure 2:
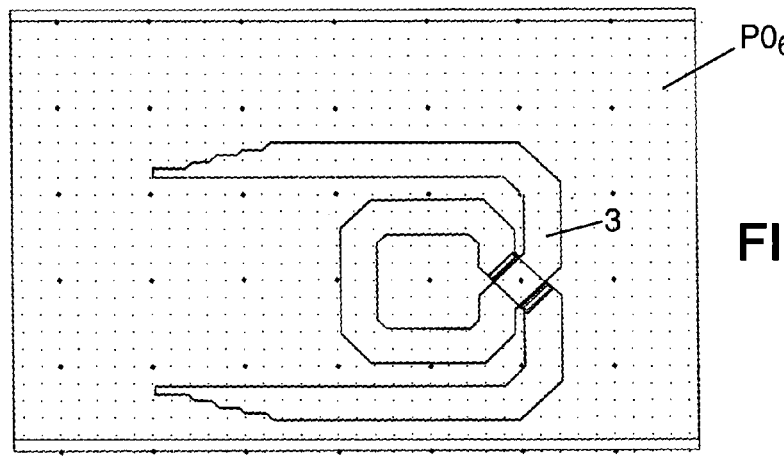
FIG. 2 shows the orthogonal projection of a shield of the chip circuit of FIG. 1 on the plane of the inductor.

FIG. 2 shows the orthogonal projection $PO_6$ of the shield 6 on the plane $P_1$ of the inductor 3.

The shield 6 is connected to the ground of the chip circuit 1. The distance $z_1$ between the planes $P_1$ and $P_2$ is less than 500 μm. In one advantageous embodiment, $z_1$ is less than 300 μm.

Instead of the inductor 3 of the VCO, it is the shield 6 that intercepts the electromagnetic field lines radiated from the components integrated on the chip 2.

In the embodiment in question, the chip circuit 1 further includes a second support 7, parallel to the package 4, and which, like the latter, provides a retention function. The second support 7 is for example a standard electronic board or PCB (printed circuit board). The PCB board 7 is attached to the assembly consisting of the BGA package 4 and the chip 2 by means of solder balls or bumps 8 that are placed between the PCB 7 and the BGA package 4, these bumps 8 electrically connecting these two elements.

The distance from the chip 2 to the PCB board 7 is determined by the diameter of the bumps 8 used. In the embodiment in question, the final diameter of the bumps 8 after mounting is 500 microns.

A second shield 9 is produced from a metallic layer of the PCB 7. It is connected to the ground of the chip circuit 1.

The shield 9 lies in a plane $P_3$ parallel to the plane $P_1$ of the inductor 3. It is placed in such a way that its orthogonal projection on the plane $P_1$ includes the inductor 3.

The distance $z_2$ between the planes $P_1$ and $P_3$ is less than 500 μm. In an advantageous embodiment, $z_2$ is less than 300 μm.

Figure 3:
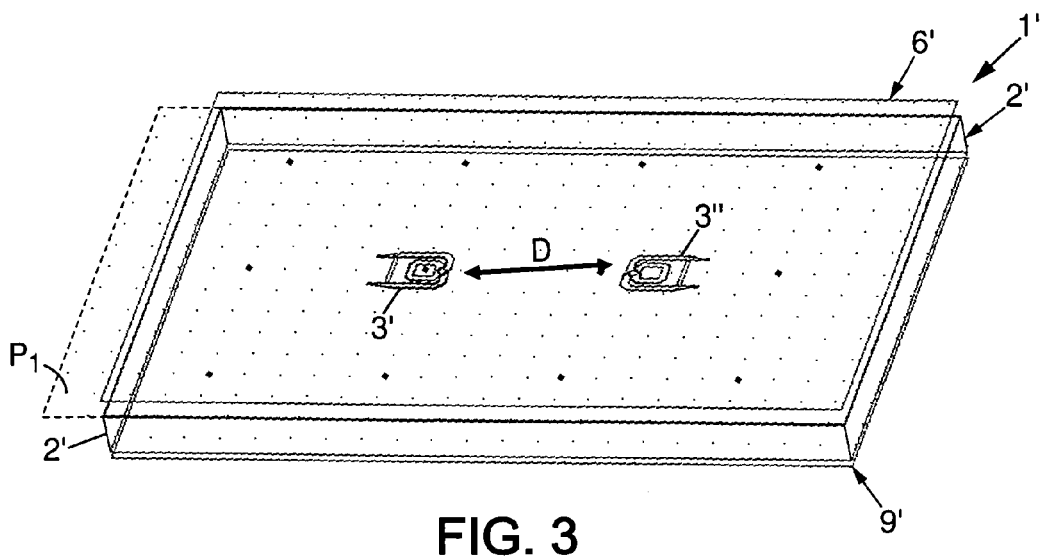
FIG. 3 shows a chip circuit according to the invention corresponding to simulations made.

Simulations of a chip circuit 1', shown in perspective in FIG. 3 and similar to that shown in FIG. 1, have been carried out. In FIG. 3, an element corresponding to an element in FIG. 1 bearing the reference X bears the reference X'.

The chip circuit 1' comprises a chip 2' which integrates a VCO with an inductor 3'. The chip 2' considered for these measurements further integrates another inductor 3" formed in the substrate in the plane $P'_1$ at a distance D from the inductor 3'.

Shields 6' and 9' similar to the shields 6 and 9 described with reference to FIG. 1 are placed on either side of $P_1$. In the embodiment shown in FIG. 3, the orthogonal projections of the shields 6' and 9' on the plane $P_1$ include both inductors 3' and 3".

The parasitic effects caused by the magnetic radiation from the inductor 3" on the operation of the inductor 3', and the attenuation provided by the invention on this parasitic magnetic field experienced by the inductor 3', will be discussed below.

Figure 4A:
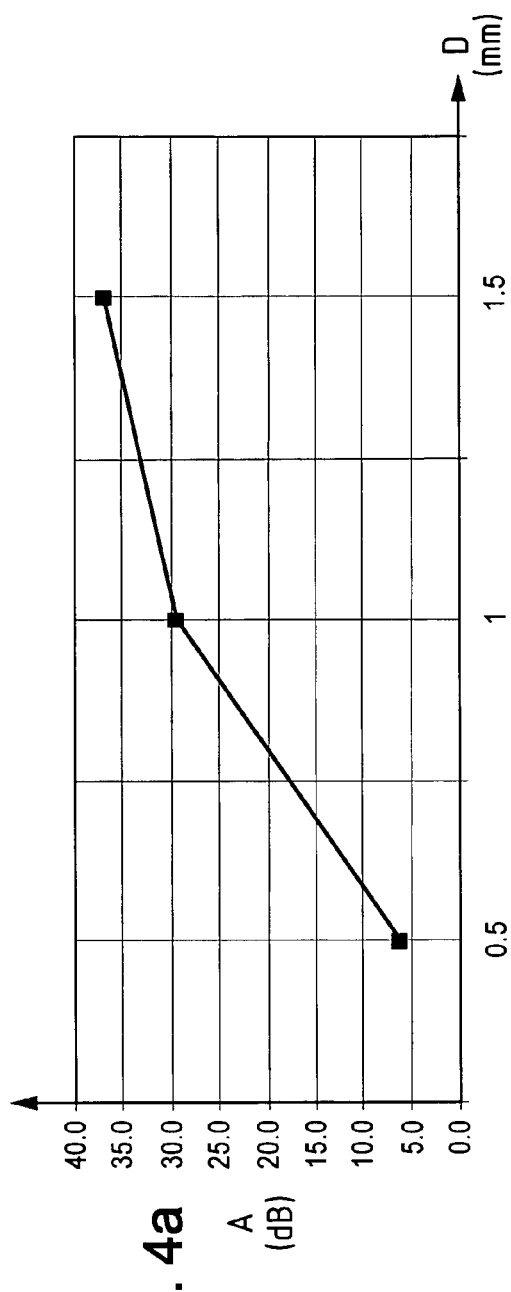
FIG. 4a is a graph showing the attenuation provided by the chip circuit of FIG. 1 of the parasitic magnetic field due to the coupling between two inductors integrated into one and the same chip, as a function of the distance between these two inductors.

This attenuation A is shown in FIG. 4a. Plotted on the y-axis is the attenuation A(H) expressed in decibels (dB), H being the parasitic magnetic field experienced by the inductor 3' before the shields 6' and 9' according to the invention have been put into place and H' being the magnetic field experienced by the inductor 3' after they have been put into place—the attenuation A(H) is equal to 20×log(H'/H). Plotted on the x-axis is the distance D in millimetres (mm) between the inductors 3' and 3".

The values indicated for the attenuation correspond to a distance $z_1$=100 μm and a distance $z_2$=300 μm, for induc-tances of the inductors 3' and 3" of 1 nanohenry (nH) and at a chip operating frequency of 3.6 GHz.

Thus, a shield 6' located at $z_1$=100 μm above the inductors 3' and 3" and a shield 9' located at $Z_{2=300}$ μm below the shields provide, when the distance D between the interfered inductor 3' and the interfering inductor 3" is equal to 1 mm, an attenuation of 30 dB of the parasitic magnetic field (at H2). The plane patterned according to the prior art attenuated the parasitic magnetic field by only a few decibels. The shields 6' and 9' according to the invention further provide an attenuation A(E) of 26 dB of the parasitic electric field E, for D=1 mm.

Moreover, for D=1 mm, they degrade the inductance of the inductor 3' by about −6.5% and its quality factor Q by about −4.3%.

The shields considered above were produced in a BGA package and a PCB board. Other embodiments may be implemented.

For example, a first shield may be produced on a first support of the chip circuit to which the chip is attached by soldering, for example a support of the IPAD (integrative passive and active device) type. In this case, a second shield may be produced on a second support of the chip circuit, for example a BGA package, the inductor being sandwiched between the two shields. Such a chip circuit is intended to be attached to an integrated circuit via solder balls between the BGA package and the printed circuit.

The distance between the plane of the inductor and the planes of the shields external to the chip according to the invention is at most 500 μm, otherwise the shielding is ineffective.

By way of illustration, FIG. 4b shows the attenuation A(H) (as defined above with reference to FIG. 4a) as a function of the distance Z expressed in microns (μm) between the plane of the inductor and each of the planes of the shields of a chip circuit similar to that shown in FIG. 3. These planes of the shields are equidistant from the plane of the inductor (Z=z1=z2). The values indicated for the attenuation correspond to inductances of the inductors 3' and 3" of one nanohenry (nH), to a distance between the inductors 3' and 3" of 1 mm and to a chip operating frequency of 3.6 GHz.

The minimum distance between the plane of the inductor and the plane of each of the shields external to the chip according to the invention is 100 μm. Otherwise, the magnetic field generated by the inductor would be excessively disturbed and the quality factor of the inductor would be excessively degraded.

Figure 5:
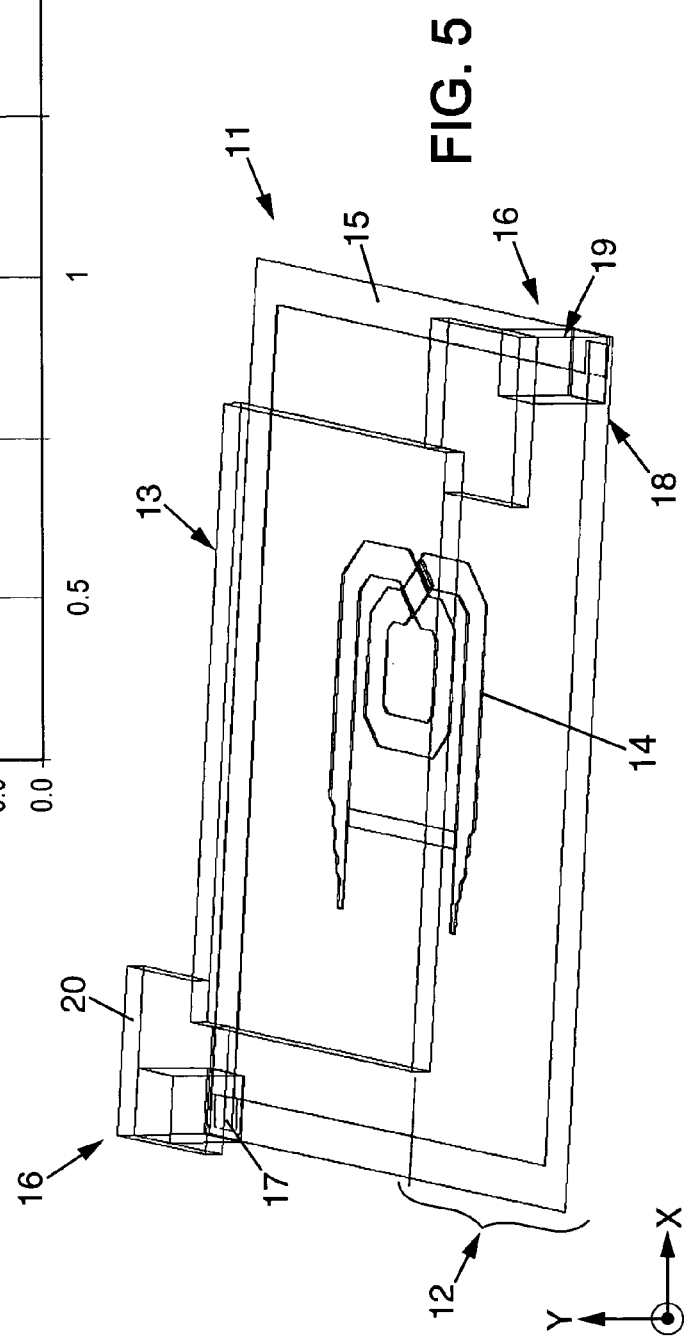
FIG. 5 shows a chip circuit in a second embodiment of the invention.

FIG. 5 shows, in perspective, a chip circuit 11 in a second embodiment of the invention. This chip circuit comprises a chip 12. It further includes a first shield 13 produced outside the chip 12. This is, for example, the first metal layer of a BGA package similar to the shield 6 shown in FIG. 1 and connected to ground.

The chip 12 includes a substantially plane inductor 14 formed on the layer 5 of the substrate.

The chip 12 further includes a shield 15 located in the silicon and formed from a metal layer 2 of the substrate of the chip 12 and lying parallel to the plane of the inductor 14. The shield 15 describes an approximately annular shape, with dimensions such that its orthogonal projection on the plane of the inductor 14 surrounds said shield.

Moreover, the shield 13 outside the chip 12 and the shield 15 formed in the substrate of the chip 12 are electrically connected via connections 16.

In the embodiment shown in FIG. 5, these connections 16 are two in number, each having an electrical connection between the layer 2 and the layer 5 of the chip 12 and consisting, in the silicon, of a vertical metal cylinder or via 17. Each connection 16 further includes, on the layer 5 of the chip, a metal pad 18 in contact with the via 17. This pad 18 bears on a metal bump 19 allowing the pad 18 to be electrically connected to a metal plate 20 lying in the plane of the shield 13 and in contact with the latter.

The dimensions, in the form (X×Y×Z) are, for example, (40 µm×40 µm×6.71 µm) for the via 17, (80 µm×80 µm×2.5 µm) for the pad 18 and (80 µm×80 µm×100 µm) for the bump 19.

Figure 6:
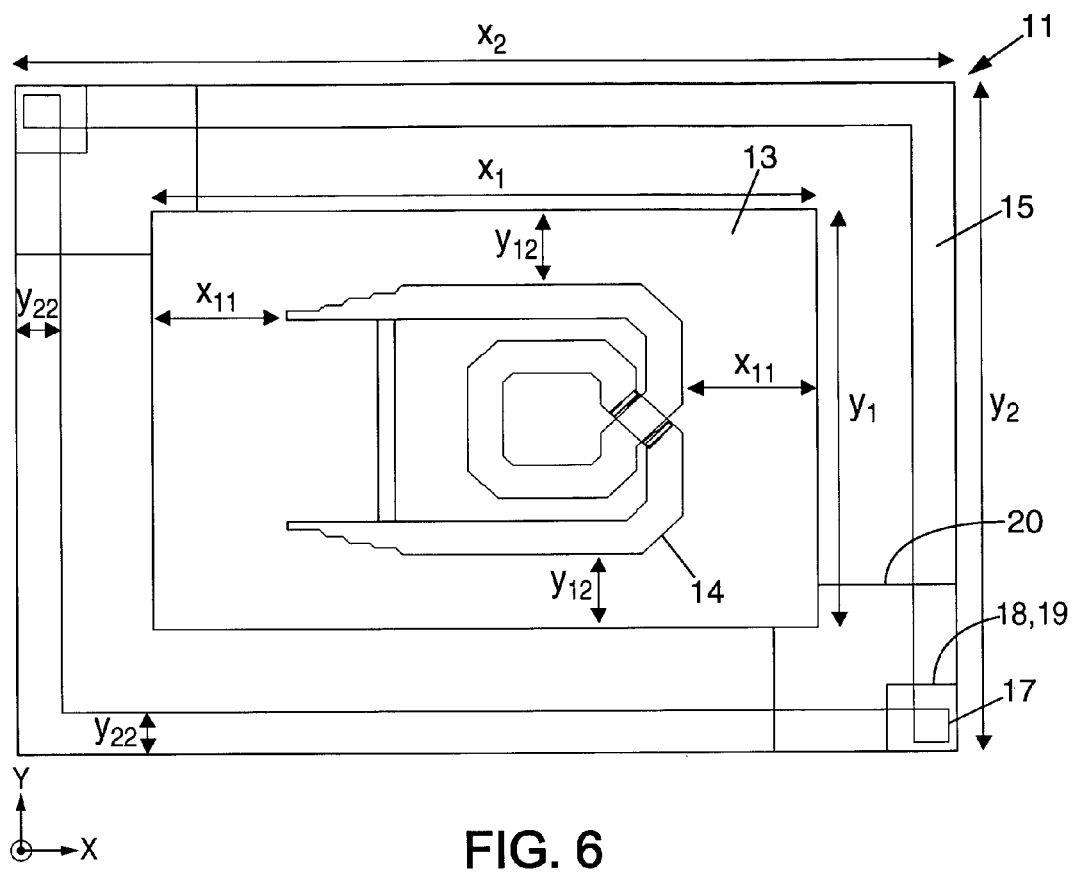
FIG. 6 shows a top view of FIG. 5.

FIG. 6 shows a top view of the chip circuit 11 shown in FIG. 4.

The inductor is centred relative to the orthogonal projections of the two shields 13 and 15 on the plane of the inductor 14.

The ring described by the shield 15 has a thickness of $y_{22}=0.05$ mm, a length dimension $x_2$ of 1.05 mm and width dimension $y_2$ of 0.8 mm. The shield 13 has a length $x_1$ of 0.75 mm and a width $y_1$, of 0.5 mm.

With these dimensions, the orthogonal projection of the shield 13 on the plane 14 of the inductor includes the latter and extends beyond it lengthwise, on either side, by $x_{11}=0.15$ mm and widthwise, on either side, by $y_{12}=0.09$ mm.

The orthogonal projection of the shield 15 on the plane of the inductor in the example in question thus extends beyond the inductor lengthwise, on either side, by 0.25 mm.

In another embodiment, both $x_{11}$ and $y_{12}$ are greater than or equal to 0.15 mm.

In another embodiment, the orthogonal projection of the shield 15 on the plane of the inductor in the example in question thus extends the inductor widthwise, on either side, by 0.25 mm.

Figure 7:
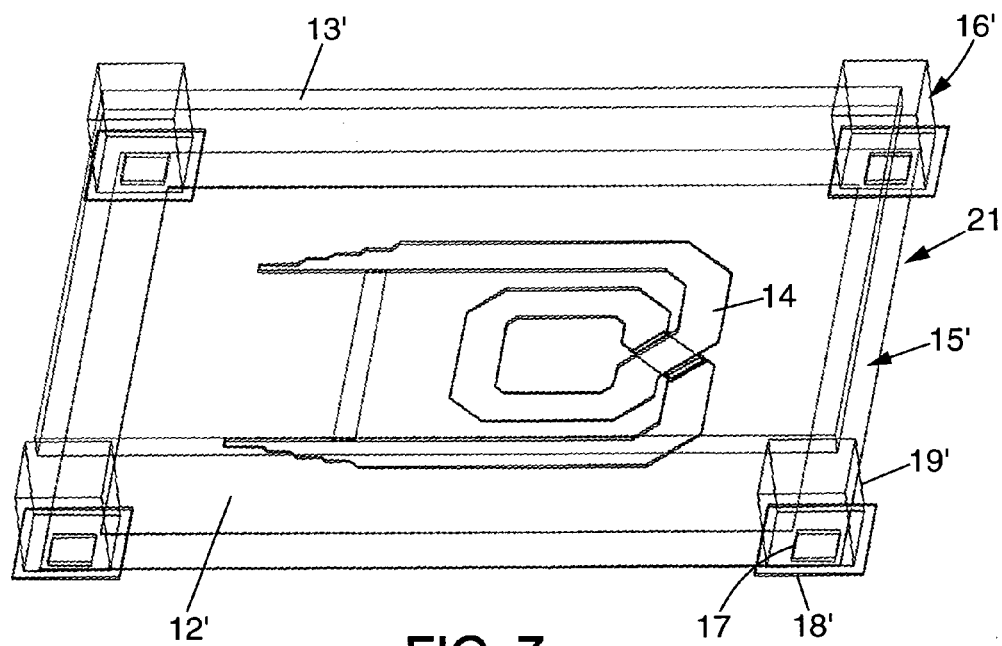
FIG. 7 shows a chip circuit in a third embodiment of the invention.

In the embodiment shown in perspective in FIG. 7, a chip circuit 21 comprising a chip 12' is similar to that shown in FIG. 5, except that, instead of the two electrical connections 16 between the shields 13 and 15, the chip circuit 21 has four electrical connections 16' between two shields 13' and 15' that are similar to the shields 13 and 15. Each connection 16' comprises a via 17 of dimensions (40 µm×40 µm×6.71 µm), a pad 18' of dimensions (100 µm×100 µm×2.5 µm) and a bump 19' that connects the pad 18' directly to the shield 13.

The number of connections between a shield in the substrate and a shield outside the chip, the two shields lying parallel to the plane of the inductor and sandwiching it, allows the effects of the parasitic signal shielding produced to be adjusted.

FIGS. 8a and 8b are tables illustrating the effects at H2 of a shield according to the embodiment shown in FIG. 6 with two connections, and that shown in FIG. 7 with four connections, respectively, as a function of the various forms of electromagnetic coupling between the sensitive inductor 14 and an interfering inductor 14" located on the same chip 12 in the plane of the inductor 14, with the same coordinate along the X axis, outside the orthogonal projection of the shield 15, 15', and such that the distance along the Y axis between the interfering coil and the closer side of the shield 15, 15' is equal to d=1 mm, as shown in FIG. 9.

The relevant attenuations of the coupling between the two inductors are those relating to the mutual inductance M, the mutual capacitance C, the magnetic field H and the electric field E, i.e. A(M), A(C), A(H), A(E). Moreover, the variations "Delta Q" in the quality factor Q of the inductor 14 that are provided by the shields are also given in these tables.

The relative distances between the plane of the inductor and the respective planes of the shield or shields according to the invention are adjusted according to the geometry of the inductor to be shielded, to the distance between the interfering component and the interfered component, to the attenuation that it is desired for the shield to provide, and to the degradation in the characteristics of the inductor that is tolerated (inductance and quality factor).

However, the distances indicated below may advantageously be adopted.

With one or both shields lying outside the silicon, the distance between this shield or these shields and the plane of the inductor is between 100 µm and 300 µm.

If in addition to a shield outside the chip there is a shield placed in the silicon, the latter shield in the silicon will advantageously be at a distance of less than 30 µm from the plane of the inductor. In the case of the silicon technology considered in the present description, this distance will be advantageously chosen to be 2.5 µm beneath the inductor.

If in addition to a shield outside the chip there is a shield placed in the silicon, this shield in the silicon will advantageously be at a minimum distance from the inductor of 100 µm, in the plane defined by the X and Y axes.

A shield according to the invention for a sensitive inductor that it is desired to protect from the interfering radiation from a component also present on the chip is particularly effective when the distance, in the plane of the inductor, between the inductor and the interfering component, is greater than or equal to 0.5 mm. For example, a distance not less than 1 mm is very suitable. Thus, the invention allows a shield to be placed in the near-field region in the case of an inductor (i.e. it provides protection against an interfering component located in the same chip). The shield produced is effective not only as regards the electric field but also the magnetic field. Existing metal structures in the supports of the chip circuit (package, module, PCB) are used, thereby minimizing the cost of the operation. Any degradation in the performance (inductance and quality factor) of the inductor to be protected is maintained. It is intended that the present invention encompass such changes and modifications as fall within the scope of the appended claims.

What is claimed is:

1. A chip circuit comprising:
   a chip, said chip comprising:
     a semiconductor substrate; and
     substantially plane components formed on the substrate, among which there are at least one emitting component capable of emitting electromagnetic radiation and an inductor that is sensitive to incident electromagnetic radiation; and
   a first shield external to the chip, the first shield lying parallel to a plane of the inductor, the first shield placed opposite the inductor at a distance of less than about 500 microns, thus making it possible for the sensitive inductor to be shielded from the at least one emitting component while maintaining a quality factor of the inductor.

2. The chip circuit according to claim 1, wherein a distance between the plane of the inductor and the first shield is greater than or equal to 100 microns.

3. The chip circuit according to claim 1, wherein a distance between the sensitive inductor and the at least one emitting component is greater than 1 millimetre.

4. The chip circuit according to claim 1, wherein an orthogonal projection of the first shield on the plane of the inductor includes the entire inductor.

5. The chip circuit according to claim 4, wherein the orthogonal projection of the first shield on the plane of the inductor extends beyond at least one edge of the inductor by at least 150 microns.

6. The chip circuit according to claim 1, wherein the chip lies parallel to a first support, a distance from the chip to the first support being determined by a diameter of bumps of a first type that are used for electrically connecting the chip to the first support, the first shield being produced in the first support.

7. The chip circuit according to claim 6, further comprising a second shield lying parallel to the plane of the inductor and placed opposite the inductor at a distance of between 100 and 500 microns, the first and second shields lying on different sides of the inductor.

8. The chip circuit according to claim 7, further comprising a second support parallel to the first support, the first and second supports being located on different sides of the chip, a distance from the chip to the second support being determined by a diameter of bumps of a second type that are used for electrically connecting the first support to the second support, the second shield being produced in the second support.

9. The chip circuit according to claim 6, wherein a final diameter of the bumps of the first type is 150 microns.

10. The chip circuit according to claim 8, wherein a final diameter of the bumps of the second type is 500 microns.

11. The chip circuit according to claim 1, further comprising a second shield lying parallel to the plane of the inductor and placed opposite the inductor, the first and second shields lying on different sides of the inductor, wherein the second shield has an annular shape, and wherein an orthogonal projection of the second shield on the plane of the inductor surrounds the inductor.

12. The chip circuit according to claim 11, wherein a distance between the plane of the inductor and the second shield is less than or equal to 30 microns.

13. The chip circuit according to claim 11, wherein the orthogonal projection of the second shield on the plane of the inductor extends beyond at least one edge of the inductor by 0.25 mm.

14. The chip circuit according to claim 11, wherein the second shield is formed on the substrate of the chip.

15. The chip circuit according to claim 1, wherein the chip comprises a voltage controlled oscillator (VCO) and the sensitive inductor is an element of the VCO.

16. A circuit, comprising: an integrated circuit chip comprising (i) an emitting component capable of emitting electromagnetic radiation and (ii) an inductor that is sensitive to incident electromagnetic radiation; and a first shield external to the integrated circuit chip, the first shield lying parallel to a plane of the inductor, the first shield placed opposite the inductor and at least partially shielding the inductor from the emitting component.

17. The circuit of claim 16, further comprising:

a second shield lying parallel to the plane of the inductor and placed opposite the inductor, the first and second shields lying on different sides of the inductor.

18. The circuit of claim 17, wherein:

the first shield is placed opposite the inductor at a distance of less than about 500 microns; and the second shield is placed opposite the inductor at a distance of between 100 and 500 microns.

19. The circuit of claim 17, wherein the second shield has an annular shape, and wherein an orthogonal projection of the second shield on the plane of the inductor surrounds the inductor.

20. A method, comprising:

operating an integrated circuit that includes a chip having (i) an emitting component emitting electromagnetic radiation and (ii) an inductor that is sensitive to incident electromagnetic radiation; and shielding the inductor from the emitting component using a shield external to the chip, the shield lying parallel to a plane of the inductor, the shield placed opposite the inductor at a distance of less than about 500 microns.

* * * * *